(12) United States Patent
Rizzo

(10) Patent No.: US 6,430,085 B1
(45) Date of Patent: Aug. 6, 2002

(54) MAGNETIC RANDOM ACCESS MEMORY HAVING DIGIT LINES AND BIT LINES WITH SHAPE AND INDUCED ANISOTROPY FERROMAGNETIC CLADDING LAYER AND METHOD OF MANUFACTURE

(75) Inventor: Nicholas D. Rizzo, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/940,319

(22) Filed: Aug. 27, 2001

(51) Int. Cl.[7] .......................... G11C 11/15; H01L 21/00
(52) U.S. Cl. .................... 365/173; 365/171; 365/227; 365/226; 438/3
(58) Field of Search ............................. 365/173, 171, 365/227, 226, 225.5, 243.5; 438/3, 795

(56) References Cited

U.S. PATENT DOCUMENTS

| | | | |
|---|---|---|---|
| 4,103,315 A | 7/1978 | Hempstead et al. | 360/110 |
| 4,663,685 A | 5/1987 | Tsang | 360/113 |
| 5,528,440 A | 6/1996 | Fontana et al. | 360/113 |
| 5,659,499 A | 8/1997 | Chen et al. | 365/158 |
| 5,917,749 A | 6/1999 | Chen et al. | 365/173 |
| 5,953,248 A | 9/1999 | Chen et al. | 365/158 |
| 6,351,409 B1 * | 2/2002 | Rizzo et al. | 365/158 |

FOREIGN PATENT DOCUMENTS

JP  6-61293  * 3/1994  .......... H01L/21/60

* cited by examiner

Primary Examiner—Andrew Q. Tran
(74) Attorney, Agent, or Firm—William E. Koch (57) ABSTRACT

A magneto-electronic component includes an electrically conductive layer (310, 410) for generating a magnetic field and having a length (301, 401) and a width (302, 402) substantially perpendicular to and substantially smaller than the length. The magneto-electronic component also includes a ferromagnetic cladding layer (320, 420) located adjacent to the electrically conductive layer. The ferromagnetic cladding layer has a shape anisotropy substantially parallel to the length of the electrically conductive layer and also has an induced anisotropy that is non-parallel to the shape anisotropy.

41 Claims, 2 Drawing Sheets

MAGNETIC RANDOM ACCESS MEMORY HAVING DIGIT LINES AND BIT LINES WITH SHAPE AND INDUCED ANISOTROPY FERROMAGNETIC CLADDING LAYER AND METHOD OF MANUFACTURE

FIELD OF THE INVENTION

This invention relates to electronics, in general, and to micromachined magneto-electronic components and methods of manufacture, in particular.

BACKGROUND

A Magnetic Random Access Memory (MRAM) is a micromachined magneto-electronic component that uses magnetic fields to change memory states of individual magnetic memory cells within the component. The magnetic fields are typically generated by conducting currents through electrically conductive lines. A ferromagnetic cladding layers can be positioned around each of the electrically conductive lines to focus the magnetic fields in a desired direction to shield adjacent magnetic memory cells within the MRAM from the magnetic fields to prevent inadvertently changing the memory states of the adjacent magnetic memory cells. Additionally, the ferromagnetic cladding layer can be positioned around each of the electrically conductive lines to significantly increase the magnitudes of the magnetic fields. Therefore, the use of this ferromagnetic cladding layer enables the MRAM to be used in low power applications by reducing the magnitudes of currents required to be conducted through the electrically conductive lines. Further reductions in power consumption, however, are needed as the demand for portable electronic applications increases.

Accordingly, a need exists for a micromachined magneto-electronic component that reduces the amount of power required for operating the micromachined magneto-electronic component. A need also exists for a method of manufacturing the micromachined magneto-electronic component.

BRIEF DESCRIPTION OF THE DRAWING FIGURES.

The invention will be better understood from a reading of the following detailed description, taken in conjunction with the accompanying drawing figures in which.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

Moreover, the terms top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

DETAILED DESCRIPTION OF THE DRAWING FIGURES

Figure 1:
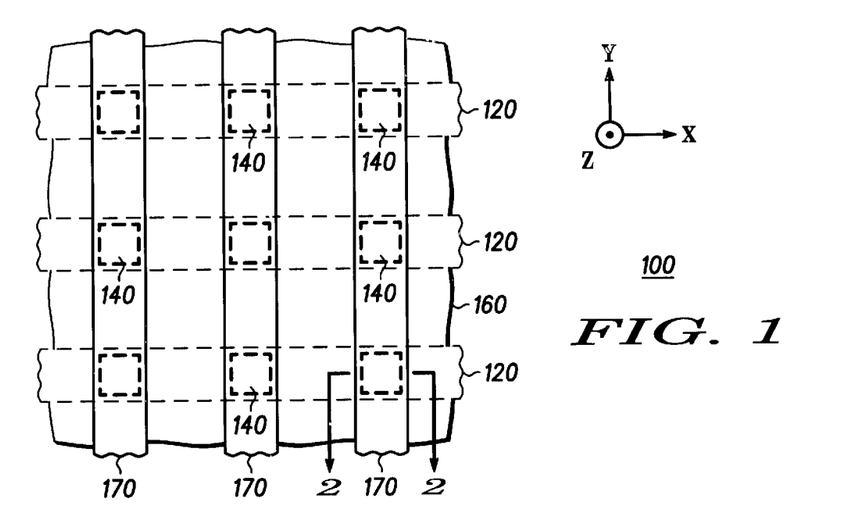
FIG. 1 illustrates a top view of a portion of the micromachined magneto-electronic component in accordance with an embodiment of the invention.
Figure 2:
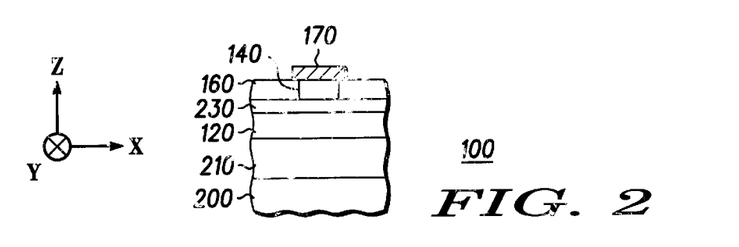
FIG. 2 illustrates a cross-sectional view of a portion of the micromachined magneto-electronic component of FIG. 1 taken along a section line 2—2 in FIG. 1 in accordance with an embodiment of the invention.

FIG. 1 illustrates a top view of a portion of a micromachined magneto-electronic component 100, and FIG. 2 illustrates a cross-sectional view of a portion of micromachined magneto-electronic component 100 taken along a section line 2—2 in FIG. 1. As an example, micromachined magneto-electronic component 100 can be a magnetic memory component such as an MRAM, or micromachined magneto-electronic component 100 can be some other type of magnetic transducer.

Micromachined magneto-electronic component 100 comprises a substrate 200 and, optionally, an electrically insulative layer 210 located over substrate 200. As an example, substrate 200 can be comprised of a semiconductor material or an electrically insulative material. As an example, electrically insulative layer 210 can be comprised of an electrically insulative material such as silicon dioxide or silicon nitride. Electrically insulative layer 210 can be eliminated if substrate 200 is electrically insulative.

Micromachined magneto-electronic component 100 also comprises a first plurality of digit lines 120 located over electrically insulative layer 210 and substrate 200. In the preferred embodiment, each of digit lines 120 are substantially identical and parallel to each other and can be manufactured simultaneously with each other, as explained in more detail hereinafter.

Micromachined magneto-electronic component 100 further comprises a plurality of bits or multi-state magnetic memory cells 140 spaced across or located over digit lines 120. In the preferred embodiment, magnetic memory cells 140 are arranged in a square or rectangular grid pattern over digit lines 120. As known in the art, portions of magnetic memory cells 140 have a fixed or set magnetic direction.

These portions of the magnetic memory cells are referred to as the "fixed layers" within magnetic memory cells 140. As known in the art and as an example, the fixed layers can include an antiferromagnetic layer. Magnetic memory cells 140 also comprise, among other features, "free layers" having adjustable magnetic directions that can be parallel or anti-parallel to the magnetic directions of the fixed layers in magnetic memory cells 140. The free layers are the memory-storing portions of magnetic memory cells 140.

Micromachined magneto-electronic component 100 additionally comprises a plurality of bit lines 170. Bit lines 170 are located over and cross over magnetic memory cells 140 and digit lines 120. In the preferred embodiment, each of bit lines 170 are substantially identical and parallel to each other and can be manufactured simultaneously with each other. Also in the preferred embodiment, each of bit lines 170 are also preferably substantially orthogonal or perpendicular to digit lines 120, and this orthogonal configuration is also known as a cross-point architecture. Bit lines 170 can be similar in structure to digit lines 120, except that bit lines 170 are "upside-down" versions of digit lines 120 as explained in more detail hereinafter.

Micromachined magneto-electronic component 100 still further comprises an electrically insulative layer 230 and an electrically insulative layer 160. Electrically insulative layer 230 is located between magnetic memory cells 140 and digit lines 120. Electrically insulative layer 160 is located substantially coplanar with magnetic memory cells 140 and is also located between bit lines 170 and electrically insulative layer 230. As an example, electrically insulative layers 230 and 160 can be comprised of the same or different electrically insulative materials, and each of electrically insulative layers 230 and 160 can be comprised of a plurality of layers.

The operation of micromachined magneto-electronic component 100 is briefly described as follows. To change a memory state of a particular one of magnetic memory cells 140, a current is conducted through the particular one of digit lines 120 that underlies the particular one of magnetic memory cells 140, and a current is also conducted through the particular one of bit lines 170 that overlies the particular one of magnetic memory cells 140. The currents in the particular ones of digit lines 120 and bit lines 170 each produce circumferential magnetic fields as described by Maxwell's equations. The magnitudes of the magnetic fields are proportional to the magnitudes of the currents conducted through the particular ones of digit lines 120 and bit lines 170.

The magnetic fields change or rotate a magnetization direction of a free layer in the particular one of magnetic memory cells 140. The magnetization direction of the free layer can be changed by up to one hundred eighty degrees. Reversal of the magnetization direction of the free layer can occur when an easy axis magnetic field and a hard axis magnetic field are applied to a magnetic memory cell approximately simultaneously. As illustrated in FIG. 1, the easy axis of magnetic memory cells 140 is substantially parallel to the X-axis, and the hard axis of magnetic memory cells 140 is substantially parallel to the Y-axis. The easy axis magnetic field is provided by bit lines 170, and the hard axis magnetic field is provided by digit lines 120.

The resistance of a particular one of magnetic memory cells 140 is dependent upon whether the magnetization of the free layers and fixed layers are parallel or anti-parallel with each other. When a magnetization direction of a free layer is parallel with a magnetization direction of a fixed layer within a particular one of magnetic memory cells 140, the particular one of magnetic memory cells 140 has a minimum resistance. When a magnetization direction of a free layer is anti-parallel with a magnetization direction of a fixed layer within a particular one of magnetic memory cells 140, the particular one of magnetic memory cells 140 has a maximum resistance. The resistance of the particular one of magnetic memory cells 140 can be detected by conducting a current through the particular one of bit lines 170 that is electrically coupled to the particular one of magnetic memory cells 140.

As explained in more detail hereinafter, each of digit lines 120 and each of bit lines 170 have an electrically conductive layer and a ferromagnetic cladding layer. The ferromagnetic cladding layers have an other anisotropy that is non-parallel with their respective shape anisotropies. The non-parallel anisotropy may be induced in the ferromagnetic cladding layer by using well-known techniques such as depositing or annealing the ferromagnetic cladding layer in a magnetic field or obliquely depositing the ferromagnetic cladding layer and an underlayer.

In a first embodiment, the sides of the ferromagnetic cladding layers in digit lines 120 have induced anisotropies along a first axis, or the Z-axis, and the sides of the ferromagnetic cladding layers in bit lines 170 also have induced anisotropies along the first axis. This first axis is substantially and simultaneously perpendicular to the easy axes of digit lines 120 and bit lines 170 and is also substantial and simultaneously perpendicular to the surface of substrate 200 over which digit lines 120, bit lines 170, and magnetic memory cells 140 are located.

In a second embodiment, the bottom portions of the ferromagnetic cladding layers of digit lines 120 can have induced anisotropies along a second axis, such as the Y-axis, and the top portions of ferromagnetic cladding layers of bit lines 170 can have induced anisotropies along a third axis, such as the X-axis, which is different from the second axis. The third axis or X-axis is substantially perpendicular to the easy axis of bit lines 170, and the second axis or Y-axis is substantially perpendicular to the easy axis of digit lines 120.

In a third embodiment, the sides of the ferromagnetic cladding layers of bit lines 170 and the ferromagnetic cladding layer of digit lines 120 have their induced anisotropies of the first embodiment, and the bottom portions of the ferromagnetic cladding layers of bit lines 170 and digit lines 120 have their respective induced anisotropies of the second embodiment. The manufacturing processes for these embodiments are described hereinafter.

As also explained in more detail hereinafter, the use of ferromagnetic cladding layers having induced anisotropies that are non-parallel to shape anisotropies provide increased magnetic permeabilities for the ferromagnetic cladding layers in the electrically conductive lines of a magneto-electronic component, and the increased magnetic permeabilities provide several ID advantages. First, a larger magnitude of magnetic field can be generated by a given magnitude of current conducted through the electrically conductive line. Second, the magnetic field is better shielded from adjacent magnetic memory cells to prevent the inadvertent switching of the memory states of the adjacent magnetic memory cells. Third, the ferromagnetic cladding layer may have fewer problems with multiple domains. As explained hereinafter, the non-parallel induced anisotropy can be produced in the ferromagnetic cladding layer by using a ferromagnetic material with an induced uniaxial magnetic anisotropy.

Figure 3:
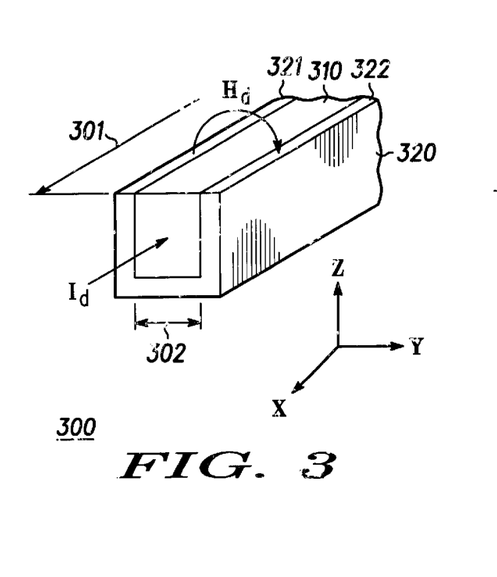
FIG. 3 illustrates a cross-sectional, isometric view of portion of a write-line in a micromachined magneto-electronic component in accordance with an embodiment of the invention.

FIG. 3 illustrates a cross-sectional, isometric view of a portion of a write-line in a micromachined magnetoelectronic component. As an example, the portion of the write-line illustrated in FIG. 3 can be a portion of a digit line 300 in an MRAM, and digit line 300 in FIG. 3 can be similar to each of digit lines 120 in FIGS. 1 and 2. Digit line 300 in FIG. 3 has an easy axis along the X-axis. Digit line 300 is also referred to as an electrically conductive line.

Digit line 300 comprises an electrically conductive layer 310 for generating a magnetic field. According to the right-hand rule, a current "$I_d$" conducted through electrically conductive layer 310 in the negative "X" direction generates a circumferential magnetic field "$H_d$". Electrically conductive layer 310 is comprised of an electrically conductive material such as, for example, copper or aluminum.

As an example, electrically conductive layer 310 can have a height of approximately four hundred nanometers and a width of approximately four hundred nanometers. In the preferred embodiment, electrically conductive layer 310 has a length 301, which is substantially parallel to the X-axis, and a width 302, which is substantially parallel to the Y-axis. Width 302 is substantially perpendicular to and substantially smaller than length 301. In this preferred embodiment, electrically conductive layer 310 has a width of less than or equal to approximately one micrometer and a length significantly greater than one micrometer.

Digit line 300 further comprises a ferromagnetic cladding layer 320 located adjacent to and contiguous with electrically conductive layer 310. Ferromagnetic cladding layer 320 enables digit line 300 to generate a greater magnitude of magnetic field above digit line 300 in the positive "Z" direction for a given magnitude of current conducted through electrically conductive layer 310. Ferromagnetic cladding layer 320 is comprised of a ferromagnetic material such as, for example, a nickel iron alloy like $Ni_{80}Fe_{20}$. As an example, ferromagnetic cladding layer 320 can have a thickness of approximately twenty-five nanometers.

As illustrated in FIG. 3, ferromagnetic cladding layer 320 is preferably located at three of the four sides of electrically conductive layer 310. In this embodiment, ferromagnetic cladding layer 320 has ends or edges 321 and 322. In alternative embodiments, ferromagnetic cladding layer 320 can be located only at one side or at two continuous or discontinuous sides of the four sides of electrically conductive layer 310.

A ferromagnetic cladding layer has a shape anisotropy due to demagnetization charge at the edges of the ferromagnetic cladding layer. The shape anisotropy is uniaxial. The shape anisotropy has a symmetry axis that is substantially parallel to an easy axis of the electrical line of which the ferromagnetic cladding layer is a part, and the symmetry axis of the shape anisotropy is also parallel to a length of an electrically conductive layer around which the ferromagnetic cladding layer is located. The demagnetization charge produces a magnetic field boost associated with the ferromagnetic cladding layer, but the demagnetization charge also reduces the permeability of the ferromagnetic cladding layer.

The ferromagnetic cladding layer provides an enhancement factor of approximately two to the magnetic field produced by the electrically conductive line with a current "I." The magnetic field ($H_{clad}$) produced by the electrically conductive line having a ferromagnetic cladding layer, for a given magnitude of current (I), can be described by the following equation:

$$H_{clad} H_{sat} \mu I$$

where $\mu$ is the magnetic permeability of the ferromagnetic cladding layer and where $H_{sat}$ is the maximum field produce by the ferromagnetic cladding layer at saturation. The magnetic permeability is described approximately by the following equation:

$$\mu = M_s/H_{k0}$$

where $M_s$ is the saturation magnetization, and $H_{k0}$ is the shape anisotropy of the ferromagnetic cladding layer determined primarily by the geometry of the ferromagnetic cladding layer. A thinner ferromagnetic cladding layer will have higher permeability since $H_{k0}$ δ, where δ is the thickness of the ferromagnetic cladding layer. However, $H_{sat}$ δ, so that the field boost provided by the ferromagnetic cladding layer is relatively independent of the thickness of the ferromagnetic cladding layer.

If, however, the ferromagnetic cladding layer also has an induced anisotropy that is non-parallel to the easy axis of the electrically conductive line, then the induced anisotropy subtracts from the shape anisotropy due to the geometry of the ferromagnetic cladding layer. Thus, the permeability is enhanced for the same ferromagnetic cladding thickness (i.e., the same $H_{sat}$), which results in a larger magnetic field produced by the ferromagnetic cladding layer for a given current "I". Again, the easy axis of the electrically conductive line is substantially parallel to the length of the electrically conductive line. In the preferred embodiment, the induced anisotropy of the ferromagnetic cladding layer is perpendicular to the easy axis of the electrically conductive line of which the ferromagnetic cladding layer is a part. Also in the preferred embodiment, the induced anisotropy is uniaxial or bi-directional along an axis. Accordingly, in the preferred embodiment, the induced anisotropy can point in either direction along the axis.

The subtraction of an induced anisotropy from the shape anisotropy increases the permeability of the ferromagnetic cladding layer such that the permeability of the ferromagnetic cladding layer is greater than a permeability of a different ferromagnetic cladding layer having the same shape anisotropy, but substantially devoid of a non-parallel induced anisotropy. In particular, when the induced anisotropy is perpendicular to the shape anisotropy:

$$\mu = M_s/(H_{k0} - H_k)$$

where $H_k$ is the induced anisotropy of the ferromagnetic cladding layer. Experiments have empirically shown the permeability of the ferromagnetic cladding layer increased by at least thirty percent when the ferromagnetic cladding layer includes a transverse induced anisotropy.

With the increased permeability of the ferromagnetic cladding layer, the magnetic field produced for a given magnitude of current will be increased by the following approximate factor when the induced anisotropy is substantially perpendicular to the easy axis of the electrically conductive line in which the ferromagnetic cladding layer is located:

$$H_{k0}/(H_{k0} - H_k).$$

Thus, for example, if $H_k$ is approximately twenty-five Oersted (Oe), a shape anisotropy of approximately one hundred Oe would be reduced to approximately 75 Oe, creating a twenty-five percent (25%) increase in the magnetic field produced by the ferromagnetic cladding layer. Accordingly, the ferromagnetic cladding layer having a non-parallel induced anisotropy decreases a magnitude of current required to be conducted through the electrically conductive layer to generate a predetermined magnitude of a magnetic field compared to a different ferromagnetic cladding layer substantially devoid of the non-parallel induced anisotropy.

The increased permeability of the ferromagnetic cladding layer also has an additional benefit in that the ferromagnetic cladding layer may now be easier to saturate, which reduces problems with domain structures within the ferromagnetic cladding layer. Furthermore, the ability of the ferromagnetic cladding layer to shield external magnetic fields is also proportional to the permeability of the ferromagnetic cladding layer. Therefore, an induced anisotropy that is non-parallel with the easy axis of the electrically conductive line in which the ferromagnetic cladding layer is located will also enhance the shielding provided by the ferromagnetic cladding layer. In particular, the non-parallel induced anisotropy increases shielding of the magnetic field provided by the ferromagnetic cladding layer compared to shielding of a magnetic field provided by a different ferromagnetic cladding layer comprising the same shape anisotropy and substantially devoid of the non-parallel induced anisotropy.

Because the shape anisotropy $H_{k0}$ of the ferromagnetic cladding layer can be as large as one hundred to two hundred Oe for typical ferromagnetic cladding thicknesses of approximately twenty-five nanometers (nm) and line widths of approximately one micrometer ($\mu$m), a ferromagnetic cladding layer with substantial induced anisotropy will be required to have a significant increase in permeability when the induced cladding anisotropy axis is set transverse to the shape anisotropy axis. A ferromagnetic cladding layer comprised of nickel iron, such as $Ni_{80}Fe_{20}$, has a typical induced $H_k$ of five Oe, which is too small to give a significant increase in permeability. However, there exists a range of magnetic alloys such as, for example, Nickel Iron Cobalt (NiFeCo), Cobalt Zirconium Tantalum (CoZrTa), or Cobalt Iron Aluminum (CoFeAl) that have $H_k$ ranging from approximately twenty to one hundred Oe and can, therefore, provide substantial transverse anisotropy for a significant permeability enhancement. Thinner ferromagnetic cladding layers will have a smaller shape anisotropy $H_{k0}$, making the requirement for substantial $H_k$ less stringent.

In a first embodiment, all portions of ferromagnetic cladding layer 320 in FIG. 3 can have the non-parallel induced anisotropy. In a second embodiment, only a portion of ferromagnetic cladding layer 320 has the non-parallel induced anisotropic property. As an example of this second embodiment, only the bottom portion, or the portion within the "X-Y" plane, of ferromagnetic cladding layer 320 can have the non-parallel induced anisotropic property. As a different example of the second embodiment, only the sides, or the portions within the "X-Z" plane, of ferromagnetic cladding layer 320 can have the non-parallel induced anisotropic property. The techniques for manufacturing these different embodiments are explained hereinafter.

Figure 4:
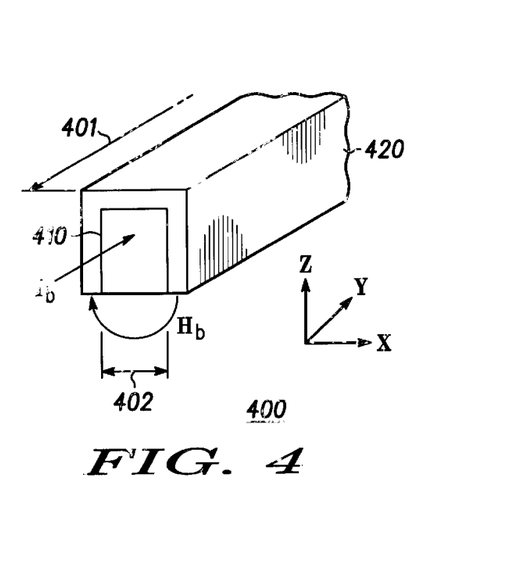
FIG. 4 illustrates a cross-sectional, isometric view of a portion of another write-line in the micromachined magneto-electronic component in accordance with an embodiment of the invention.

FIG. 4 illustrates a cross-sectional, isometric view of a portion of another write-line in a micromachined magneto-electronic component. As an example, the portion of the write-line illustrated in FIG. 4 can be a portion of a bit line 400 in an MRAM, and bit line 400 in FIG. 4 can be similar to each of bit lines 170 in FIGS. 1 and 2. Bit line 400 in FIG. 4 has an easy axis along the Y-axis. Bit line 400 is also referred to as an electrically conductive line.

Bit line 400 comprises an electrically conductive layer 410 and a ferromagnetic cladding layer 420. Electrically conductive layer 410 and ferromagnetic cladding layer 420 of bit line 400 in FIG. 4 can be similar to electrically conductive layer 310 and ferromagnetic cladding layer 320, respectively, of digit line 300 in FIG. 3. Electrically conductive layer 410 has a length 401, which is substantially parallel to the Y-axis, and a width 402, which is substantially parallel to the X-axis and can be similar to width 302 of electrically conductive layer 310 in FIG. 3. Electrically conductive layer 410 can also have a height similar to the height of electrically conductive layer 310 in FIG. 3. A current "$I_b$" conducted through electrically conductive layer 410 in the positive "Y" direction generates a circumferential magnetic field "$H_b$". The different variations of digit line 300 in FIG. 3 can also be applied to bit line 400 in FIG. 4.

There are several general methods that can be used to induce a transverse, uniaxial, magnetic anisotropy in the ferromagnetic cladding layer. The preferred method is to deposit the ferromagnetic cladding layer in a magnetic field whose direction is transverse to the easy axis of a digit or bit line.

A second method to induce a transverse, uniaxial, magnetic anisotropy in a ferromagnetic cladding layer is to deposit the ferromagnetic cladding layer and then anneal the ferromagnetic cladding layer at one or more temperatures well-above room temperature in a magnetic field having a direction transverse to the easy axis of a digit or bit line. Appropriate post-deposition, magnetic annealing temperatures can be in the range of approximately 100 to 300 degrees Celsius.

In one embodiment, the magnetic anneal of the ferromagnetic cladding layer occurs after depositing the ferromagnetic cladding layer, but before patterning of the digit or bit lines so that the ferromagnetic cladding layer is still a continuous film on the substrate during the magnetic anneal. By leaving the film continuous, the magnetic field will saturate the magnetization of the entire film, including the sides and the bottom or top of the digit or bit line, in a direction transverse to the easy axis of digit or bit line. Therefore, the magnetic anneal will induce a transverse anisotropy in all sides of the digit or bit lines.

If the magnetic anneal is performed after patterning of the digit and bit lines, the magnetic field can be applied in the surface or plane of the substrate or perpendicular to the surface or plane of the substrate. In this embodiment, the magnetic field can saturate the magnetization of the ferromagnetic cladding layer on the bottom or top portions of the digit or bit line so that the anneal will induce a transverse anisotropy in the bottom or top portions alone. An in-plane field anneal has a particular advantage for the bit line. A magnetic memory cell usually requires an anneal in a magnetic field whose direction is transverse to the easy axis of the bit line. Therefore, the same magnetic anneal that is used to improve the magnetic memory cell properties will induce the transverse anisotropy in the top portions of the ferromagnetic cladding layers for the bit lines.

If the magnetic field is applied perpendicular to the plane of the substrate during the magnetic anneal, the magnetization of the sides of the ferromagnetic cladding layers for both the digit and bit lines will be saturated in a direction transverse to the easy axis direction of the digit or bit lines. In this way, a transverse anisotropy can be induced in the sides of the ferromagnetic cladding layers for both the digit and bit lines at the same time. The magnetic direction of the fixed layers in the magnetic memory cells will not be affected significantly by this process because the magnetization of the free and fixed layers in the magnetic memory cells remain in-plane with the surface of the substrate and because the magnetic field required to saturate the magnetization of the free and fixed layers out-of-plane will be at least approximately ten thousand Oe.

The first and second methods can also be combined for optimum effect. For example, the ferromagnetic cladding layer can be deposited in a field that induces an anisotropy transverse to the easy axis of the layer. The ferromagnetic cladding layer can then undergo a magnetic anneal to additionally enhance the magnitude and alignment of the intrinsic anisotropy beyond that of the as-deposited layer. In addition, the magnetic anneal can stabilize the induced anisotropy against changes in its magnitude or direction caused by other magnetic fields and/or by elevated temperatures.

A third method to induce a transverse, uniaxial, magnetic anisotropy in the ferromagnetic cladding layer is to pass a current through the bit and/or digit lines, after their formation, while the bit and/or digit lines are heated to temperatures above room temperature. In the preferred embodiment, the magnitude of the currents should be large enough to generate magnetic fields having magnitudes that are large enough to saturate the magnetization of the ferromagnetic cladding layers in the bit and/or digit lines. The magnetic fields are circumferential around the bit and/or digit lines and, therefore, have a preferred geometry for saturating all sides of the ferromagnetic cladding layers with their magnetization transverse to the easy axis of the bit and/or digit lines. When conducting the currents, the temperature of the bit and/or digit lines is preferably as high as possible to minimize the time required for this process, but the temperature should also remain below the blocking temperature of the antiferromagnetic layers in the fixed layers of the magnetic memory cells.

A fourth method to induce a transverse, uniaxial, magnetic anisotropy in the ferromagnetic cladding layer is to deposit the ferromagnetic cladding layer with the plane of the substrate positioned at an angle of less than ninety degrees to the direction of the incident material flux. This type of deposition, referred to as an oblique deposition, is well-known to induce a magnetic anisotropy that is transverse to the incident flux direction and in the plane of the substrate. In this method, the wafer is positioned to have the easy axis of the digit or bit lines parallel to the plane of incidence of deposited material, the plane of incidence being parallel to the direction of incident flux and parallel to the normal direction to the substrate. In a variation of this method, an underlayer, such as for example Tantalum (Ta), can be deposited at an oblique angle relative to the surface of the substrate to induce a transverse anisotropy while the ferromagnetic cladding layer is deposited at a normal incidence or at an angle perpendicular to the surface of the substrate. This variation can be desirable because it is difficult to produce a film of uniform thickness using oblique deposition and because it is desirable to have the ferromagnetic cladding be of uniform thickness across the substrate.

Figure 5:
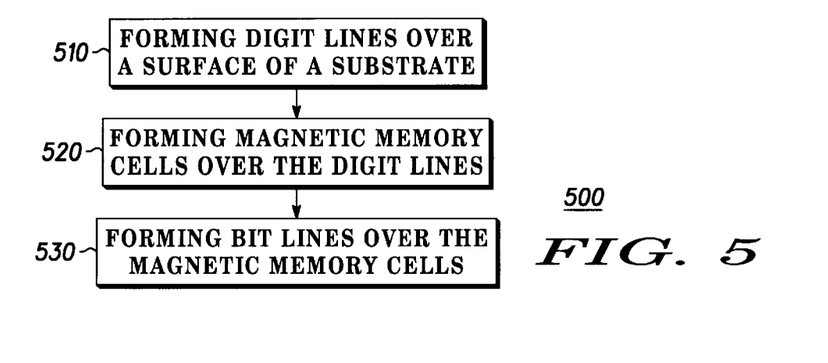
FIG. 5 illustrates a flow chart of a method of manufacturing a micromachined magneto-electronic component in accordance with-an embodiment of the invention.

FIG. 5 illustrates a flow chart 500 of a method of manufacturing a micromachined magneto-electronic component such as, for example, micromachined magneto-electronic component 100 in FIGS. 1 and 2. At a step 510 of flow chart 500, digit lines are formed over a surface of a substrate. As an example, each of the digit lines can comprise an electrically conductive layer and a ferromagnetic cladding layer.

Next, at a step 520 of flow chart 500, magnetic memory cells are formed over the digit lines and over the surface of the substrate. Each of the magnetic memory cells has a free layer and a fixed layer. The magnetization direction of the free layer can be changed during operation of the magnetic memory cells, but the magnetization direction of the fixed layer remains constant or fixed during operation of the magnetic memory cells.

Then, at a step 530 of flow chart 500, bit lines are formed over the magnetic memory cells and over the surface of the substrate. As an example, each of the bit lines can comprise an electrically conductive layer and a ferromagnetic cladding layer.

Figure 6:
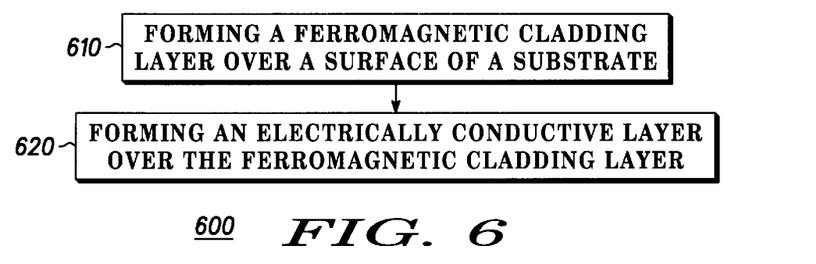
FIG. 6 illustrates a flow chart of a method of manufacturing digit or bit lines in a micromachined magneto-electronic component in accordance with an embodiment of the invention.

FIG. 6 illustrates a flow chart 600 of a method of manufacturing digit or bit lines in a micromachined magneto-electronic component such as, for example, micromachined magneto-electronic component 100 in FIGS. 1 and 2. As an example, flow chart 600 of FIG. 6 can illustrate additional details of each of steps 510 and 530 in flow chart 500 of FIG. 5. In a first embodiment, at a step 610 of flow chart 600 in FIG. 6, a ferromagnetic cladding layer is formed over a surface of a substrate, and at a step 620 of flow chart 600 in FIG. 6, an electrically conductive layer is formed over the ferromagnetic cladding layer. This embodiment of flow chart 600 can be used to form a digit line. In a different embodiment, step 620 occurs before step 610. This different embodiment can be used to form a bit line.

As an example, the surface and the substrate in step 610 of flow chart 600 in FIG. 6 can be the same surface and the same substrate in step 510 of flow chart 500 in FIG. 5. In the preferred embodiment, the electrically conductive layer of step 620 in flow chart 600 of FIG. 6 is located adjacent to the ferromagnetic cladding layer, is used for generating a magnetic field, and has a length and a width substantially perpendicular to and substantially smaller than the length. Also in the preferred embodiment, the ferromagnetic cladding layer comprises a shape anisotropy substantially parallel to the length of the electrically conductive layer and an induced anisotropy non-parallel to the shape anisotropy.

Figure 7:
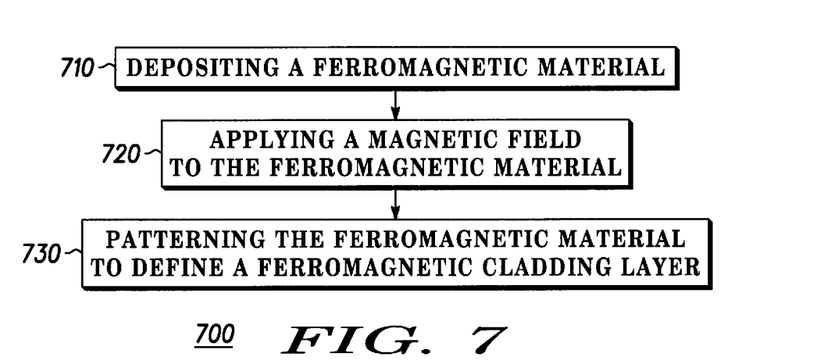
FIG. 7 illustrates a flow chart of a method of manufacturing ferromagnetic cladding layers in digit or bit lines of a micromachined magneto-electronic component in accordance with an embodiment of the invention.

FIG. 7 illustrates a flow chart 700 of a method of manufacturing ferromagnetic cladding layers in digit or bit lines of a micromachined magneto-electronic component such as, for example, micromachined magneto-electronic component 100 in FIGS. 1 and 2. As an example, flow chart 700 of FIG. 7 can illustrate additional details of step 610 in flow chart 600 of FIG. 6. At a step 710 of flow chart 700 in FIG. 7, a ferromagnetic material is deposited, and at a step 720 of flow chart 700 in FIG. 7, a magnetic field is applied to the ferromagnetic material. Then, at a step 730 of flow chart 700, the ferromagnetic material is patterned to define a ferromagnetic cladding layer.

The magnetic field of step 720 has a direction substantially transverse to an easy axis of the electrically conductive layer to provide the ferromagnetic material with the induced anisotropy. In a first embodiment of step 720, the magnetic field is also applied in a direction substantially in-plane with the surface of the substrate. In a second embodiment of step 720, the magnetic field is also applied in a direction substantially transverse to the surface of the substrate over which the ferromagnetic material is located.

In a first embodiment of flow chart 700, step 720 occurs after step 710 and before step 730. In this embodiment of flow chart 700, the application of the magnetic field during step 720 can occur while additionally heating or annealing the ferromagnetic material. Also in this embodiment, the direction of the magnetic field can be substantially transverse to an easy axis of the bit or digit line and substantially in-plane with the surface of the substrate.

In a second embodiment of flow chart 700, step 720 occurs after step 730. In this embodiment of flow chart 700, the application of the magnetic field during step 720 can occur while additionally heating or annealing the ferromagnetic cladding layer. Also in this embodiment, the direction of the magnetic field can be substantially transverse to an easy axis of the electrically conductive layer and either substantially in-plane with the surface of the substrate or substantially transverse to the surface of the substrate.

In the preferred embodiment of flow chart 700, step 720 occurs before step 730 so that any sidewall portions of the ferromagnetic material that are substantially perpendicular to the surface of the substrate and other portions of the ferromagnetic material that are substantially parallel to the surface of the substrate can be simultaneously saturated to provide the induced anisotropy for the bit and/or digit lines.

In a third embodiment of flow chart 700, step 720 occurs simultaneously with step 710. In this embodiment of flow chart 700, the direction of the magnetic field of step 720 can be substantially transverse to an easy axis of the electrically conductive layer and substantially in-plane with the surface of the substrate. In this embodiment, it is not necessary to apply heat to the ferromagnetic material from an external heat source to achieve the induced anisotropy in the ferromagnetic material.

Additionally, in this third embodiment of flow chart 700, further steps can be performed. For example, after the simultaneous performance of steps 710 and 720, the ferromagnetic material can be heated or annealed. As an example, this heating or annealing step can occur without simultaneously applying an other magnetic field. Alternatively, while the ferromagnetic material is heated or annealed, an other magnetic field can be applied to the ferromagnetic material in an other direction substantially transverse to an easy axis of the bit or digit line. If the simultaneous heating and other magnetic field application occurs before step 730, then the other direction of the other magnetic field can be substantially transverse to an easy axis of the electrically conductive layer and substantially in-plane with the surface of the substrate. If, however, the simultaneous heating and other magnetic field application occurs after step 730, then the other direction of the other magnetic field can be substantially transverse to the easy axis of the electrically conductive layer and either substantially transverse to the surface of the substrate or substantially in-plane with the surface of the substrate.

Figure 8:
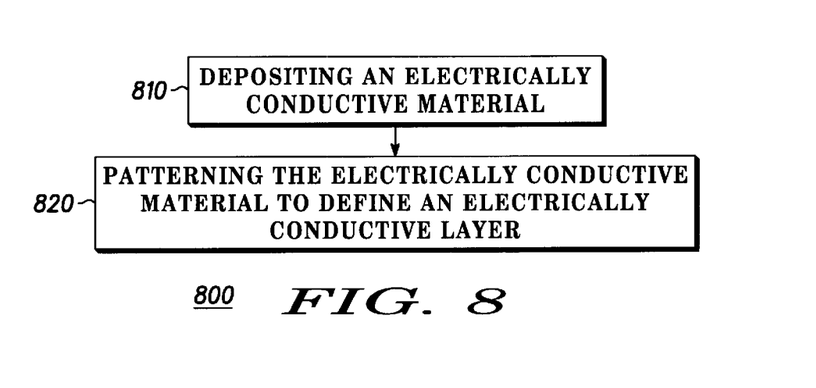
FIG. 8 illustrates a flow chart of a method of manufacturing electrically conductive layers in digit or bit lines of a micromachined magneto-electronic component in accordance with an embodiment of the invention.

FIG. 8 illustrates a flow chart 800 of a method of manufacturing electrically conductive layers in digit or bit lines of a micromachined magneto-electronic component such as, for example, micromachined magneto-electronic component 100 in FIGS. 1 and 2. As an example, flow chart 800 of FIG. 8 can illustrate additional details of step 620 in flow chart 600 of FIG. 6. At a step 810 of flow chart 800 in FIG. 8, an electrically conductive material is deposited, and at a step 820 of flow chart 800 in FIG. 8, the electrically conductive material is patterned to define an electrically conductive layer.

In one embodiment of the method of manufacturing the micromachined magneto-electronic component, the patterning of the ferromagnetic material in step 730 of flow chart 700 in FIG. 7 is performed after at least a portion of step 620 of flow chart 600 in FIG. 6 or after at least a portion of flow chart 800 in FIG. 8. As a specific example, the patterning of the ferromagnetic material in step 730 of flow chart 700 in FIG. 7 can be performed after the patterning of the electronically conductive material in step 820 of flow chart 800 in FIG. 8. In a variation of this embodiment, the depositing of the ferromagnetic material in step 710 of flow chart 700 in FIG. 7 is performed before the depositing of the electrically conductive material in step 810 of flow chart 800 in FIG. 8. Furthermore, the applying of the magnetic field in step 720 of flow chart 700 in FIG. 7 can be performed in any of the sequences described earlier.

As an example, the applying of the magnetic field in step 720 of flow chart 700 in FIG. 7 can be performed (1) while depositing the ferromagnetic material in step 710 of FIG. 7, (2) after depositing the ferromagnetic material in step 710 of FIG. 7 and before depositing the electrically conductive material in step 810 of FIG. 8, (3) after depositing the ferromagnetic material in step 710 of FIG. 7, after depositing the electrically conductive material in step 810 of FIG. 8, and before patterning the electrically conductive material in step 820 of FIG. 8, (4) after depositing the ferromagnetic material in step 710 of FIG. 7, after depositing the electrically conductive material in step 810 of FIG. 8, after patterning the electrically conductive material in step 820 of FIG. 8, and before patterning the ferromagnetic material in step 730 of FIG. 7, or (5) after depositing the ferromagnetic material in step 710 of FIG. 7, after depositing the electrically conductive material in step 810 of FIG. 8, after patterning the electrically conductive material in step 820 of FIG. 8, and after patterning the ferromagnetic material in step 730 of FIG. 7.

When the steps of FIGS. 6, 7, and 8 are used to manufacture the digit lines of a magneto-electronic component, the applying of the magnetic field in step 720 in flow chart 700 of FIG. 7 can occur during or after the forming of the magnetic memory cells in step 520 of flow chart 500 in FIG. 5. As an example, when the magnetic direction of the fixed layers in the magnetic memory cells is transverse to the easy axis of the digit lines, the magnetic field of step 720 in FIG. 7 can be applied simultaneously with a heating or annealing step, but after depositing the material used for the fixed layers in the magnetic memory cells. In this embodiment, the magnetic field of step 720 with the simultaneous heating or annealing step can be used to simultaneously define the induced anisotropy in the digit lines and set the magnetic direction of the fixed layers in magnetic memory cells.

When the steps of FIGS. 6, 7, and 8 are used to manufacture the bit lines of a magneto-electronic component, the applying of the magnetic field in step 720 in flow chart 700 of FIG. 7 can occur after the patterning of the ferromagnetic material in step 730 in flow chart 700 of FIG. 7. In this embodiment, the magnetic field during step 720 can be applied transverse to the easy axis of the bit line and also transverse to the surface of the substrate over which the bit lines are located. Thus, the magnetic field during step 720 can be used to simultaneously saturate any vertical sidewall portions of the ferromagnetic cladding layers in the bit and digit lines. The magnetic direction of the fixed layers in the magnetic memory cells will not be affected significantly by this process because the magnetization of the free and fixed layers in the magnetic memory cells remain in-plane with the surface of the substrate and because magnetic fields required to saturate the magnetization of the free and fixed layers out-of-plane will be at least approximately ten thousand Oe.

Therefore, an improved magneto-electronic component is provided to overcome the disadvantages of the prior art. The use of a ferromagnetic cladding layer having an induced anisotropy that is non-parallel to a shape anisotropy of the ferromagnetic cladding layer permits a larger magnetic field to be produced with the same or smaller current so that the magneto-electronic component will consume less power. The non-parallel induced anisotropy also improves the magnetic field shielding properties of the ferromagnetic cladding layer and also potentially reduces the problems associated with multiple domains in the ferromagnetic cladding layer. These advantages can be accomplished while ensuring that the ferromagnetic cladding layer remains magnetically permeable so that the ferromagnetic cladding layer is not too stiff to respond to external magnetic fields.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims.

For instance, the numerous details set forth herein such as, for example, the material compositions, the dimensions, and the angles are provided to facilitate the understanding of the invention and are not provided to limit the scope of the invention. As another example, the magnetic memory cells can have various structures, such as a cell having at least one electrically conductive layer located between the fixed and free layers of the cell or a cell having at least one electrically insulative layer located between the fixed and free layers of the cell. Moreover, the magnetic memory cells can have two or more free layers instead of one free layer and one fixed layer. Additionally, the bit lines or the digit lines can be devoid of the ferromagnetic cladding layer. Furthermore, both the bit and digit lines can include ferromagnetic layers, but either the bit lines or the digit lines can be devoid of the transverse induced anisotropy provided by their respective ferromagnetic layers.

As a further example, some features of the digit and bit lines are not illustrated in FIG. 3 or 4. For example, the digit and bit lines can include diffusion barriers separating the ferromagnetic cladding layer from the electrically conductive layer or from the electrically insulative layers surrounding the bit and digit lines. The diffusion barriers can be comprised of, for example, tantalum or titanium. As another example, the digit and/or bit lines can include electrically insulative layers separating the ferromagnetic cladding layer from the electrically conductive layer. Furthermore, various electrical connections can be made to the magnetic memory cells such as, for example, using the bit or digit lines or using separate electrical paths.

Furthermore, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. As used herein, the term "comprises," "comprising," "includes," "including," "have," "having," or any other variation thereof, are intended to cover a non-exclusive inclusion, such that a process, method, article, or apparatus that comprises a list of elements does not include only those elements, but may include other elements not expressly listed or inherent to such process, method, article, or apparatus.

What is claimed is:

1. A magneto-electronic component comprising:
   a substrate;
   an electrically conductive layer over the substrate and for generating a magnetic field and having a length and a width substantially perpendicular to and substantially smaller than the length; and
   a ferromagnetic cladding layer located adjacent to the electrically conductive layer and comprising:
      a shape anisotropy substantially parallel to the length of the electrically conductive layer; and
      an induced anisotropy non-parallel to the shape anisotropy.

2. The magneto-electronic component of claim 1 wherein:
   the induced anisotropy is substantially perpendicular to the shape anisotropy.

3. The magneto-electronic component of claim 1 wherein:
   the induced anisotropy increases a permeability of the ferromagnetic cladding layer to be greater than a permeability of a different ferromagnetic cladding layer comprising the shape anisotropy and substantially devoid of the induced anisotropy.

4. The magneto-electronic component of claim 1 wherein:
   the induced anisotropy decreases a magnitude of a current conducted through the electrically conductive layer to generate the magnetic field when the ferromagnetic cladding layer is located adjacent to the electrically conductive layer compared to a magnitude of a different current conducted through the electrically conductive layer to generate the magnetic field when a different ferromagnetic cladding layer is located adjacent to the electrically conductive layer, comprises the shape anisotropy, and is substantially devoid of the induced anisotropy.

5. The magneto-electronic component of claim 1 wherein:
   the induced anisotropy is uniaxial.

6. The magneto-electronic component of claim 1 wherein:
   the induced anisotropy subtracts from the shape anisotropy to increase a permeability of the ferromagnetic cladding layer.

7. The magneto-electronic component of claim 1 wherein:
   the induced anisotropy increases shielding of the magnetic field provided by the ferromagnetic cladding layer compared to shielding of the magnetic field provided by a different ferromagnetic cladding layer located adjacent to the electrically conductive layer, comprising the shape anisotropy, and substantially devoid of the induced anisotropy.

8. The magneto-electronic component of claim 1 further comprising:
   an additional electrically conductive layer for generating an additional magnetic field, having an additional length and an additional width substantially perpendicular to and substantially smaller than the additional length, and located over and crossing over the electrically conductive layer and the ferromagnetic cladding layer; and
   an additional ferromagnetic cladding layer located adjacent to the additional electrically conductive layer and located over and crossing over the electrically conductive layer and the ferromagnetic cladding layer and comprising:
      an additional shape anisotropy substantially parallel to the additional length of the additional electrically conductive layer; and
      an additional induced anisotropy non-parallel to the additional shape anisotropy.

9. The magneto-electronic component of claim 1 further comprising:
   a magnetic memory cell located over the electrically conductive layer and the ferromagnetic cladding layer;
   an additional electrically conductive layer for generating an additional magnetic field, having an additional length and an additional width substantially perpendicular to and substantially smaller than the additional length, and located over and crossing over the magnetic memory cell, the electrically conductive layer, and the ferromagnetic cladding layer; and
   an additional ferromagnetic cladding layer located adjacent to the additional electrically conductive layer and located over and crossing over the magnetic memory cell, the electrically conductive layer, and the ferromagnetic cladding layer and comprising:
an additional shape anisotropy substantially parallel to the additional length of the additional electrically conductive layer; and
an additional induced anisotropy non-parallel to the additional shape anisotropy.

10. The magneto-electronic component of claim 9 wherein:
the induced anisotropy increases a permeability of the ferromagnetic cladding layer to be greater than a permeability of a different ferromagnetic cladding layer comprising the shape anisotropy and substantially devoid of the induced anisotropy; and
the additional induced anisotropy increases a permeability of the additional ferromagnetic cladding layer to be greater than a permeability of an additional different ferromagnetic cladding layer comprising the additional shape anisotropy and substantially devoid of the additional induced anisotropy.

11. The magneto-electronic component of claim 10 wherein:
the induced anisotropy is uniaxial along a first axis; and
the additional induced anisotropy is uniaxial along a second axis substantially perpendicular to the first axis.

12. The magneto-electronic component of claim 9 wherein:
the induced anisotropy subtracts from the shape anisotropy to increase a permeability of the ferromagnetic cladding layer; and
the additional induced anisotropy subtracts from the additional shape anisotropy to increase a permeability of the additional ferromagnetic cladding layer.

13. A micromachined magnetic memory component comprising:
a substrate;
a first plurality of lines substantially parallel to each other, located over the substrate, and generating first magnetic fields, each of the first plurality of lines comprising:
a first electrically conductive layer having a first length and a first width substantially perpendicular to and substantially smaller than the first length; and
a first ferromagnetic cladding layer located adjacent to the first electrically conductive layer and comprising:
a first shape anisotropy substantially parallel to the first length; and
a first induced anisotropy substantially perpendicular to the first shape anisotropy;
multi-state magnetic memory cells spaced over the first plurality of lines in a grid pattern and located over the substrate; and
a second plurality of lines substantially parallel to each other, substantially orthogonal to the first plurality of lines, located over the first plurality of lines, located over the multi-state magnetic memory cells, and generating second magnetic fields, each of the second plurality of lines comprising:
a second electrically conductive layer having a second length and a second width substantially perpendicular to and substantially smaller than the second length, the second length substantially perpendicular to the first length; and
a second ferromagnetic cladding layer located adjacent to the second electrically conductive layer and comprising:
a second shape anisotropy substantially parallel to the second length; and
a second induced anisotropy substantially perpendicular to the second shape anisotropy.

14. The micromachined magnetic memory component of claim 13 wherein:
the first induced anisotropies are uniaxial along first axes substantially parallel to each other; and
the second induced anisotropies are uniaxial along second axes substantially perpendicular to the first axes.

15. The micromachined magnetic memory component of claim 14 wherein:
the first induced anisotropies increase permeabilities of the first ferromagnetic cladding layers to be greater than permeabilities of different first ferromagnetic cladding layers comprising the first shape anisotropies and substantially devoid of the first induced anisotropies; and
the second induced anisotropies increase permeabilities of the second ferromagnetic cladding layers to be greater than permeabilities of different second ferromagnetic cladding layers comprising the second shape anisotropies and substantially devoid of the second induced anisotropies.

16. The micromachined magnetic memory component of claim 15 wherein:
the first induced anisotropies increase shielding provided by the first ferromagnetic cladding layers of the first magnetic fields when the first ferromagnetic cladding layers are located adjacent to the first electrically conductive layers compared to shielding provided by the different first ferromagnetic cladding layers located adjacent to the first electrically conductive layers and comprising the first shape anisotropies and substantially devoid of the first induced anisotropies; and
the second induced anisotropies increase shielding provided by the second ferromagnetic cladding layers of the second magnetic fields when the second ferromagnetic cladding layers are located adjacent to the second electrically conductive layers compared to shielding provided by the different second ferromagnetic cladding layers located adjacent to the second electrically conductive layers and comprising the second shape anisotropies and substantially devoid of the second induced anisotropies.

17. A method of manufacturing a magneto-electronic component comprising:
forming a ferromagnetic cladding layer over a surface of a substrate; and
forming an electrically conductive layer adjacent to the ferromagnetic cladding layer for generating a magnetic field and having a length and a width substantially perpendicular to and substantially smaller than the length,
wherein:
the ferromagnetic cladding layer comprises:
a shape anisotropy substantially parallel to the length of the electrically conductive layer; and
an induced anisotropy non-parallel to the shape anisotropy.

18. The method of claim 17 wherein:
forming the ferromagnetic cladding layer comprises:
depositing a ferromagnetic material;
applying a first magnetic field to the ferromagnetic material, the first magnetic field having a direction substantially transverse to an easy axis of the electrically conductive layer to provide the ferromagnetic material with the induced anisotropy; and patterning the ferromagnetic material to define the ferromagnetic cladding layer.

19. The method of claim 18 wherein:

applying the first magnetic field occurs after depositing the ferromagnetic material and before patterning the ferromagnetic material.

20. The method of claim 19 further comprising:

heating the ferromagnetic material while applying the first magnetic field.

21. The method of claim 19 wherein:

the direction of the first magnetic field is substantially in-plane with the surface of the substrate.

22. The method of claim 18 further comprising:

heating the ferromagnetic material while applying the first magnetic field, wherein:
applying the first magnetic field occurs after patterning the ferromagnetic material.

23. The method of claim 22 wherein:

the direction of the first magnetic field is substantially in-plane with the surface of the substrate.

24. The method of claim 22 wherein:

the direction of the first magnetic field is substantially transverse to the surface of the substrate.

25. The method of claim 18 wherein:

patterning the ferromagnetic material occurs after forming at least a portion of the electrically conductive layer.

26. The method of claim 18 wherein:

applying the first magnetic field occurs while depositing the ferromagnetic material.

27. The method of claim 26 wherein:

the direction of the first magnetic field is substantially in-plane with the surface of the substrate.

28. The method of claim 27 further comprising:

heating the ferromagnetic material after depositing the ferromagnetic material.

29. The method of claim 28 further comprising:

applying an other magnetic field to the ferromagnetic material while heating the ferromagnetic material, the other magnetic field having an other direction substantially transverse to an easy axis of the electrically conductive layer.

30. The method of claim 29 wherein:

applying the other magnetic field occurs before patterning the ferromagnetic material.

31. The method of claim 30 wherein:

the other direction of the other magnetic field is substantially in-plane with the surface of the substrate.

32. The method of claim 29 wherein:

applying the other magnetic field occurs after patterning the ferromagnetic material.

33. The method of claim 32 wherein:

the other direction of the other magnetic field is substantially transverse to the surface of the substrate.

34. The method of claim 18 wherein:

the direction of the first magnetic field is substantially in-plane with the surface of the substrate.

35. The method of claim 18 wherein:

the direction of the first magnetic field is substantially transverse to the surface of the substrate.

36. The method of claim 17 further comprising:

depositing, at an oblique angle relative to the surface of the substrate, a first layer over the surface of the substrate, wherein:
forming the ferromagnetic cladding layer further comprises:
forming the ferromagnetic cladding layer over the first layer.

37. The method of claim 36 wherein:

forming the ferromagnetic cladding layer further comprises:
depositing, at an angle perpendicular the surface of the substrate, the ferromagnetic cladding layer over the first layer.

38. The method of claim 36 wherein:

forming the ferromagnetic cladding layer further comprises:
depositing the ferromagnetic cladding layer on the first layer.

39. The method of claim 38 wherein:

the first layer induces the induced anisotropy in the ferromagnetic cladding layer.

40. The method of claim 17 wherein:

forming the ferromagnetic cladding layer further comprises:
depositing, at an oblique angle relative to the surface of the substrate, the ferromagnetic cladding layer over the surface of the substrate.

41. The method of claim 17 further comprising:

heating the ferromagnetic cladding layer; and passing a current through the electrically conductive layer to form the induced anisotropy in the ferromagnetic cladding layer while the ferromagnetic cladding layer is heated.

* * * * *

UNITED STATES PATENT AND TRADEMARK OFFICE
CERTIFICATE OF CORRECTION

PATENT NO. : 6,430,085 B1
DATED : August 6, 2002
INVENTOR(S) : Rizzo

It is certified that error appears in the above-identified patent and that said Letters Patent is hereby corrected as shown below:

<u>Column 1,</u>
Line 6, after the Title, please add as a new first paragraph the following paragraph:
-- This invention was made with Government support under Agreement No. MDA972-96-3-0016 awarded by DARPA. The government has certain rights in the invention. --

Signed and Sealed this

Seventh Day of October, 2003

JAMES E. ROGAN
*Director of the United States Patent and Trademark Office*